United States Patent [19]
Suzuki et al.

[11] Patent Number: 5,783,426
[45] Date of Patent: Jul. 21, 1998

[54] SEMICONDUCTOR DEVICE HAVING SEMICONDUCTOR CHIP MOUNTED IN PACKAGE HAVING CAVITY AND METHOD FOR FABRICATING THE SAME

[75] Inventors: Katsuhiko Suzuki; Isamu Sorimachi; Akira Haga; Hiroyuki Uchida; Katsunobu Suzuki, all of Tokyo, Japan

[73] Assignee: NEC Corporation, Tokyo, Japan

[21] Appl. No.: 511,618

[22] Filed: Aug. 7, 1995

[30] Foreign Application Priority Data

Aug. 18, 1994 [JP] Japan ................................. 6-216550

[51] Int. Cl.$^6$ ................................................. H01L 21/44
[52] U.S. Cl. ........................... 438/115; 257/683; 257/704
[58] Field of Search ........................... 257/704, 683; 438/115

[56] References Cited

U.S. PATENT DOCUMENTS

| | | | |
|---|---|---|---|
| 5,256,901 | 10/1993 | Ohashi et al. | 257/704 |
| 5,278,429 | 1/1994 | Takenaka et al. | 257/704 |
| 5,293,511 | 3/1994 | Poradish et al. | 257/704 |
| 5,468,910 | 11/1995 | Knapp et al. | 257/704 |
| 5,629,562 | 5/1997 | Nomura et al. | 257/683 |

FOREIGN PATENT DOCUMENTS 1-164051   6/1989   Japan.

*Primary Examiner*—Kevin Picardat
*Attorney, Agent, or Firm*—Whitham, Curtis & Whitham

[57] ABSTRACT

The semiconductor device disclosed has a cap in which, at an undersurface periphery portion, a plurality of looped projections are formed for intercepting a continuous bubble path that may be formed for a gas to escape. The preparatory stage steps of assembling the device includes forming a plated layer on a lead frame, adhesively fixing the lead frame on a base plate, cutting and separating leads from the lead frame, and shaping the leads into a predetermined form. The assembling stage steps of the device includes mounting a semiconductor chip on the base plate and bonding electrodes on the semiconductor chip and the leads, and mounting the cap which has the looped projections for intercepting a continuous bubble path that may be formed for a gas to escape. Since the steps such as forming a plated layer and shaping the leads have been completed in the preparatory stage, the assembling steps which include the mounting of the cap having the looped projections can be efficiently carried out.

3 Claims, 7 Drawing Sheets

SEMICONDUCTOR DEVICE HAVING SEMICONDUCTOR CHIP MOUNTED IN PACKAGE HAVING CAVITY AND METHOD FOR FABRICATING THE SAME

BACKGROUND OF THE INVENTION

(1) Field of the Invention

The present invention relates to a semiconductor device and a method for fabricating the same, and more particularly to a semiconductor device in which a semiconductor chip is mounted in a package having a cavity and a method for fabricating the same.

(2) Description of the Related Art

The package for a semiconductor device is divided broadly into a resin mold package and a ceramic package. The resin mold package is low cost and suited to mass production, but problems are that the stresses from the resin cause bonding wires to be broken or the thermal stresses to develop during the mounting operation cause crack to occur in the mold resin. In the ceramic package, since the semiconductor chip is mounted within a cavity, there is no possibility for the breakage of the bonding wires, and heat and moisture resistances are excellent thereby ensuring a high reliability of the package. However, the fabrication processes thereof are complicated, leading to an extremely high manufacturing cost.

There is a package structure which has been proposed and is in practical use and in which a semiconductor chip is mounted in a cavity formed between a base plate and a cap with a lead frame sandwiched therebetween so as to avoid the stresses to the wires and enhance the reliability of the package. The structure is realized mainly as a product compatible to a surface mounting resin mold package such as a plurality of pins, a thin Quad Flat Package (QFP) and a Plastic Leaded Chip Carrier (PLCC).

FIG. 1A is a sectional view of a conventional semiconductor device of the kind explained above. FIGS. 1B and 1C are an enlarged sectional view and a plan view, respectively, of such a conventional semiconductor device for explaining problems existing therein. For fabricating such a semiconductor device, first a semiconductor chip 4 is mounted, using a silver (Ag) paste or the like, on an island 32 of the lead frame, and electrodes on a surface of the semiconductor chip and internal lead portions 31a of leads 31 are respectively interconnected by bonding wires 5.

Next, the lead frame on which the semiconductor chip 4 is mounted is sandwiched, with an adhesive agent 7 interposed, between the base plate 1 formed of, for example, aluminum (Al) and the cap 2 formed also of, for example, Al, followed by thermal hardening so that the cap 2 adheres onto the base plate 1 and that the lead frame is fixed on the base plate 1. In this way, the semiconductor chip 4 is air-tightly sealed within a cavity 6 formed between the base plate 1 and the cap 2.

Then, the lead frame is provided with soldering or tin plating, and the individual leads 31 are separated from the lead frame and then the semiconductor device is separated from the lead frame. Thereafter, the leads 31 are shaped into gull-wing forms, for example.

In the package as explained above, during the heating and hardening processes of the adhesive agent, simultaneously with the lowering of the viscosity of the adhesive agent due to the heating, there is an increase in the pressure within the cavity. When this pressure escapes from the cavity, there develops a path 9a formed by continuous bubbles to outside the cavity as shown in FIGS. 1B and 1C.

FIG. 2 is a sectional view of a semiconductor device with an improvement intended to overcome the above problem existing in the prior art shown in FIGS. 1A–1C. In this example, a hole 22 is provided in the cap 2 and, after this cap 2 is fixed on the base plate 1, the hole 22 is closed by a plug 10.

Another conventional example of the kind as explained above is disclosed in Japanese Patent Application Kokai Publication No. Hei 1-164051. FIG. 3A is a plan view of a Small Outline Package (SOP) proposed in the publication, and FIGS. 3B and 3C are sectional views taken respectively at line 3B—3B and line 3C—3C in FIG. 3A.

In the assembling of the semiconductor device, the semiconductor chip 4 is mounted on the island 32 of the lead frame and, after the chip 4 and an internal lead portion 31a are interconnected by the bonding wire 5, the lead frame on which the semiconductor chip 4 is mounted is positioned between a lower resin structure 11 and an upper resin structure 12 formed of, for example, a thermoplastic resin. As shown in FIG. 3C, the upper resin structure 12 is provided with a convex portion 12a and the lower resin structure 11 is provided with a concave portion 11a to receive the convex portion 12a. In this way, the lower resin structure 11 and the upper resin structure 12 are assembled into a unit.

Next, the resin structures 11 and 12 are in their entirety covered by a mold resin 13 using a transfer mold process.

In the above conventional semiconductor device, from the start of the assemblage to the completion thereof, it requires a large number of steps, such as (1) a step of mounting a semiconductor chip on a lead frame, (2) a step of wire bonding, (3) a step of adhesively fixing a base plate and a cap with each other (or a step of assembling and transfer molding), (4) a step of plating, (5) a step of cutting and separating the lead frame, and (6) a step of shaping leads into a predetermined form, it takes as long as 3 days or so from the start of the assemblage to the completion thereof. Especially in a product such as a gate array in which it is required to reduce a Turn Around Time (TAT) to a minimum, the reduction of the time used for the assemblage is a paramount problem to be solved.

As explained above, in the conventional example shown in FIGS. 1A–1C, the path 9a is formed by continuous bubbles when the pressure in the cavity escapes therefrom during the process of adhesively fixing the cap onto the base plate, resulting in the product in which air-tight sealing cannot be maintained. Thus, the production yield rate of such a product is low and the reliability thereof is poor.

In the improved conventional example shown in FIG. 2, the problem just explained is overcome, but there are problems that the number of components is increased and also the process of adhesively fixing requires one additional step.

In the process disclosed in Japanese Patent Application Kokai Publication No. Hei 1-164051 (shown in FIGS. 3A-3C), the semiconductor chip 4 is sealed in the resin structure followed by resin molding so that, since the double operations are required here, there is an increase in the fabrication cost. Another problem is that, during the resin molding operation, the mold resin may enter into the cavity as an undesired foreign matter.

SUMMARY OF THE INVENTION

An object of the present invention, therefore, is to overcome the problems existing in the prior art and to provide a semiconductor device and a method for fabricating the same which enables, firstly, the reduction in the number of fabrication steps and in the TAT for the production and, secondly, the attaining of an excellent air-tight sealing effect without increasing the number of fabrication steps.

According to one aspect of the invention, there is provided a semiconductor device having a base plate, a cap, a plurality of leads sandwiched between the base plate and the cap, a semiconductor chip mounted within a cavity formed between the cap and the base plate, the leads and the semiconductor chip being electrically interconnected by internal leads of the leads and electrodes of the semiconductor chip, wherein the improvement comprises a plurality of looped projections provided at an undersurface peripheral portion of the cap such that the cavity is surrounded by the looped projections.

According to another aspect of the invention, there is provided a method for fabricating a semiconductor device comprising the steps of:

forming at least one plated layer on a surface of a lead frame (FIG. 5A);

adhesively fixing the lead frame onto a base plate (FIG. 5B);

cutting and separating each of leads from the lead frame (FIGS. 5C and 5D);

forming each of the separated leads into a predetermined form (FIG. 5E);

mounting a semiconductor chip on the base plate and electrically interconnecting electrodes of the semiconductor chip and internal leads of the leads, respectively (FIGS. 6A and 6B);

mounting on the base plate a cap in which, at an undersurface periphery portion thereof, a plurality of looped projections are formed for intercepting a possible continuous bubble path formed for a gas to escape (FIG. 6C).

For the semiconductor device and the method for fabricating the same according to the invention, the lead frame that has been plated is fixed on the base plate and the processing of leads is complete during the preparatory stage of the process. Then, during the assembling stage, the bonding and the sealing of the cap having looped projections are carried out, so that the number of process steps from the start with the semiconductor chip to the completion of the product can be reduced resulting in a large reduction in the period of time required therefor. The advantage obtained by the application of the present invention is remarkable especially in the product lines such as those for gate arrays in which the reduction of TAT is strongly in need.

The invention is featured by use of the cap having the looped projections, which enables the interception of the continued bubble path which is formed for the pressure built within the cavity to escape during the sealing process, and also enables the suppression of the occurrence of defective sealing. Thus, it is possible to fabricate the device in which the manufacturing yield is enhanced and the performance is highly reliable.

BRIEF DESCRIPTION OF THE DRAWINGS

The above and other objects, features and advantages of the present invention will be apparent from the following description of preferred embodiments of the invention explained with reference to the accompanying drawings, in which.

PREFERRED EMBODIMENTS OF THE INVENTION

Now, preferred embodiments of the invention are explained with reference to the drawings.

Figure 1A:
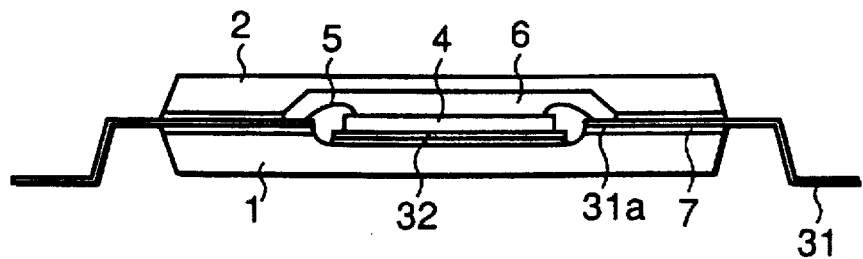
FIGS. 1A–1C are diagrams showing a first conventional example of a semiconductor device, FIG. 1A being a sectional view thereof, FIG. 1B being an enlarged sectional view of a portion of the device shown in FIG. 1A to show problems therein, and FIG. 1C being a plan view of the same.
Figure 1B:
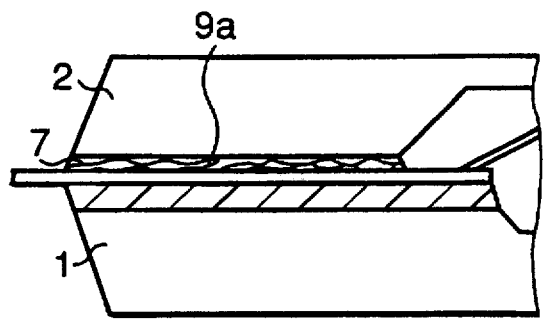
Figure 1C:
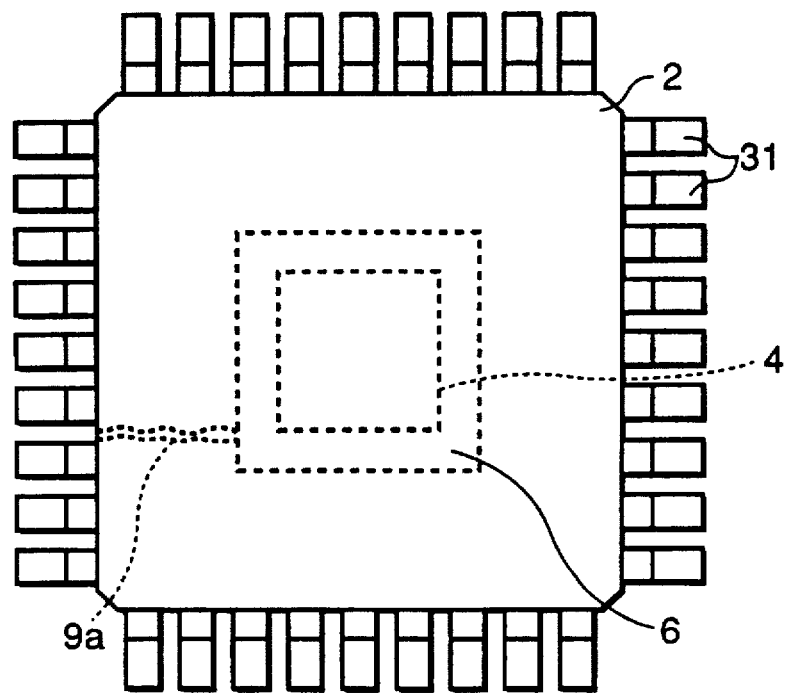
Figure 2:
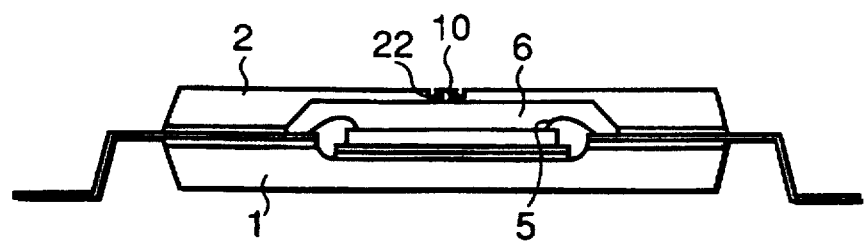
FIG. 2 is a sectional view showing a second conventional example of a semiconductor device.
Figure 3A:
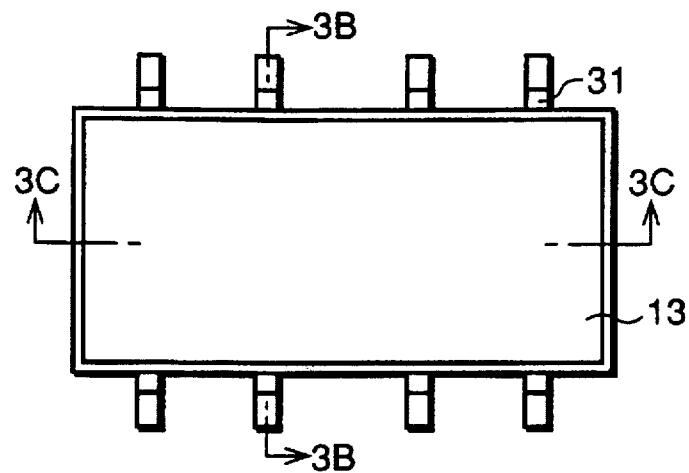
FIGS. 3A–3C are diagrams showing a third conventional example, FIG. 3A being a plan view thereof, FIG. 3B being a sectional view thereof taken along line 3B—3B in FIG. 3A, and FIG. 3C being a sectional view thereof taken along line 3C—3C in FIG. 3A.
Figure 3B:
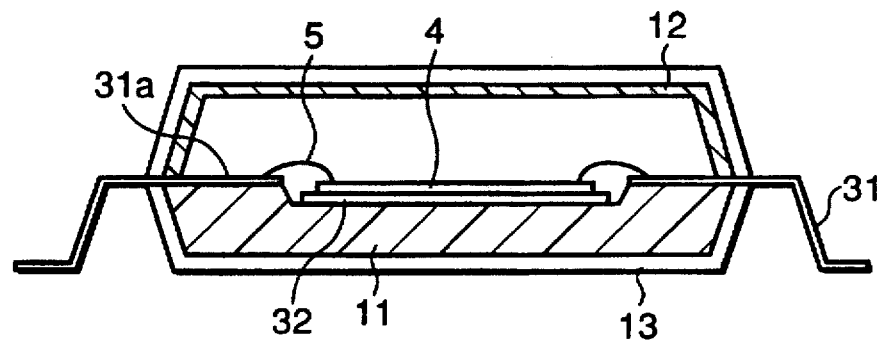
Figure 3C:
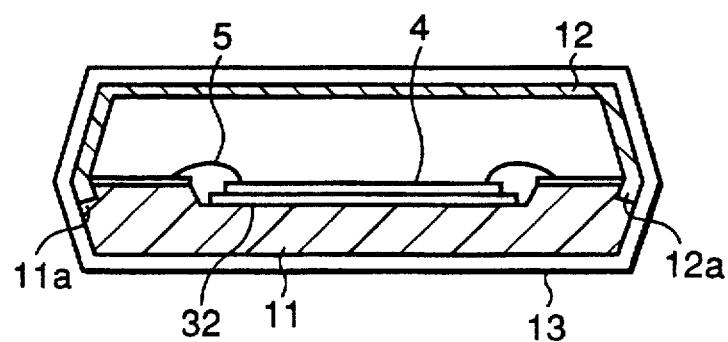
Figure 4A:
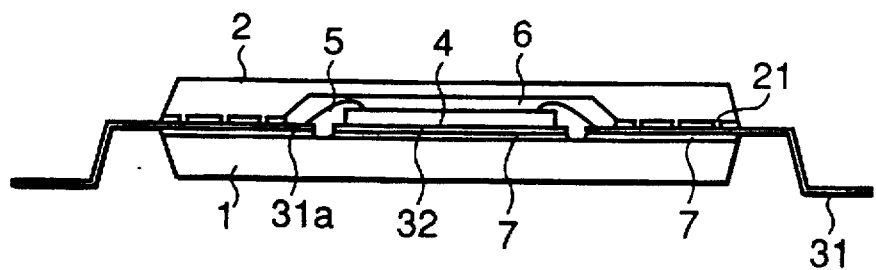
FIGS. 4A–4C are diagrams showing a first embodiment of a semiconductor device according to the invention, FIG. 4A being a sectional view thereof, FIG. 4B being an enlarged sectional view thereof, and FIG. 4C being a plan view of the same.
Figure 4B:
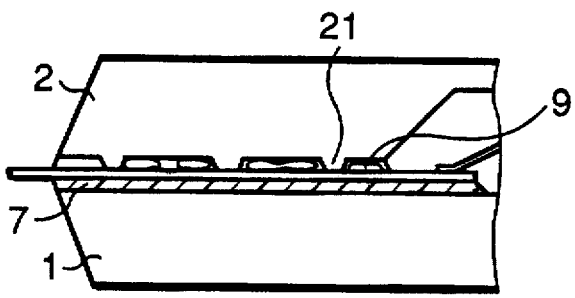

FIG. 4A is a sectional view of a semiconductor device of a first embodiment according to the invention. FIG. 4B is a partially enlarged sectional view of the semiconductor device and FIG. 4C is a plan view of the same.

As shown in FIG. 4A, leads 31 and an island 32 of a lead frame and a cap 2 are fixed on a base plate 1 by an adhesive agent 7. A semiconductor chip 4 is mounted on the island 32, and electrodes (not shown) of the semiconductor chip 4 and internal lead portions 31a of the leads 31 are interconnected by bonding wires 5, respectively.

Figure 4C:
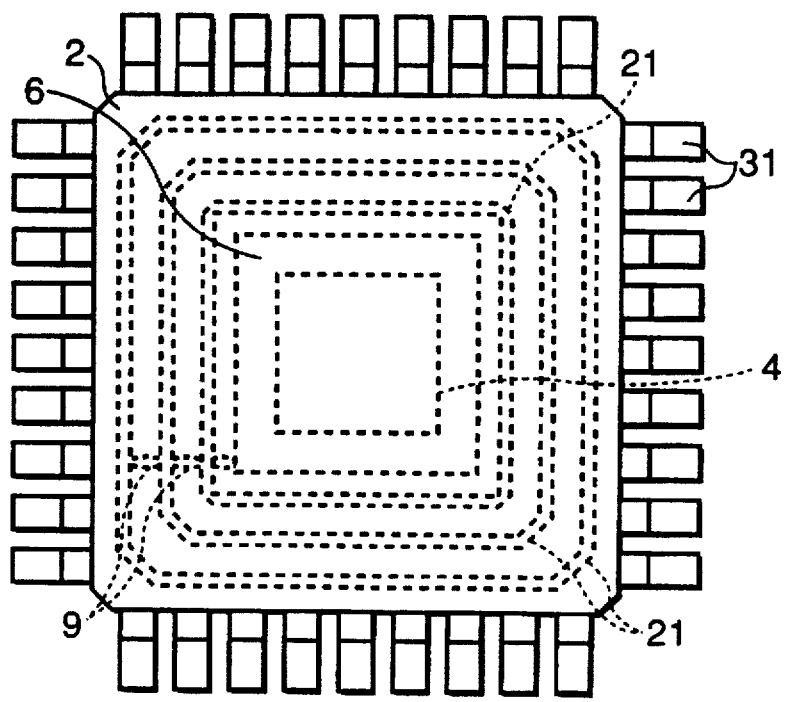

As shown in FIGS. 4A–4C, an undersurface of the cap 2 is provided with looped projections 21 in three folds each having a width of about 1 mm and a height of about 0.2–0.3 mm. During the heating and hardening of the adhesive agent 7, the looped projections 21 divide and disconnect a gas path formed for the pressure to escape from the cavity 6. As a result, as shown in FIGS. 4B and 4C, the bubbles 9 remaining therein are divided by the looped projections 21 and entrapped in the respective spaces between the looped projections 21 unlike in the conventional example wherein a gas escaping path formed by the bubbles is continuous. For convenience, FIGS. 4B and 4C show a state of the bubbles 9 as being in a line. In practice, however, the likelihood of the bubbles 9 being in a line is low so that the looped projection arrangement according to this embodiment can ensure the realization of a highly reliable sealing structure.

Now, a process for fabricating the semiconductor device of the first embodiment is explained with reference to FIGS. 5A–5E and FIGS. 6A–6D. FIGS. 5A–5E are perspective views showing states of a preparatory stage of the package which precedes an assembling stage thereof. FIGS. 6A–6D are perspective views showing states of the assembling stage of the package. In FIGS. 5A–5D and FIGS. 6A–6C, the leads are shown with the number thereof being reduced for the brevity of the diagrammatic illustration.

Figure 5A:
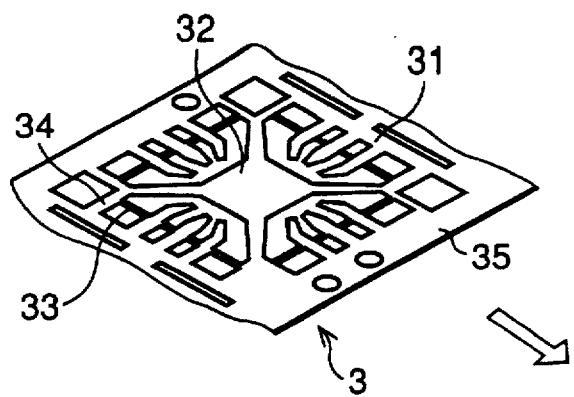
FIGS. 5A–5E are perspective views of the semiconductor device of the first embodiment according to the invention for use in explaining sequential steps during the preparatory stage (prior to assembling) of a method for fabricating the device.

First, a lead frame 3 as shown in FIG. 5A is prepared, and is plated. The lead frame 3 includes a frame 35 constituting an outer frame, an island 32 supported within the frame 35 through a plurality of suspension pins 34, a plurality of leads 31 extending from the frame 35 to the island 32, and a plurality of tie-bars 33 interconnecting the leads 31. In the plating process, a layer of nickel (Ni) having a thickness of 3 μm is provided on the lead frame 3, over which a layer of gold (Au) having a thickness of 0.5 μm is formed.

Figure 5B:
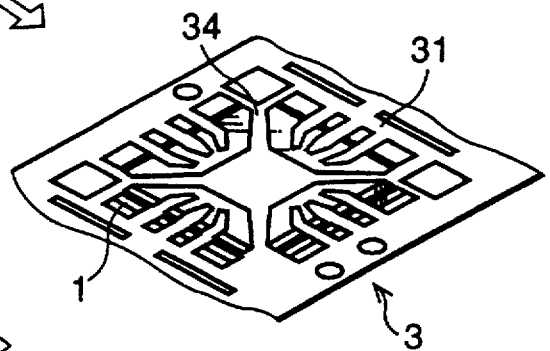

Then, as shown in FIG. 5B, the lead frame 3 is fixed on the base plate 1 using an adhesive agent. In this embodiment, the base plate 1 is of a resin molded structure.

Figure 5C:
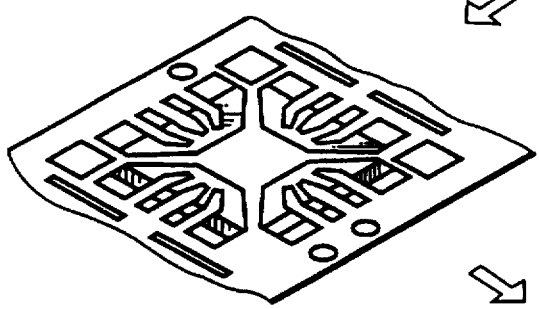
Figure 5D:
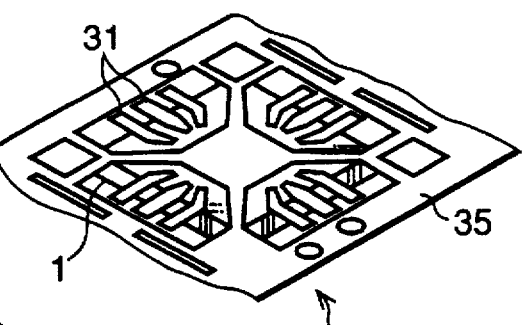

Next, as shown in FIG. 5C, the tie-bars 33 interconnecting the leads are cut away and, as shown in FIG. 5D, each lead is cut and separated from the lead frame 3. The resulting structure is such that the base plate 1 is supported on the lead frame 3 by the suspension pins 34.

Figure 5E:
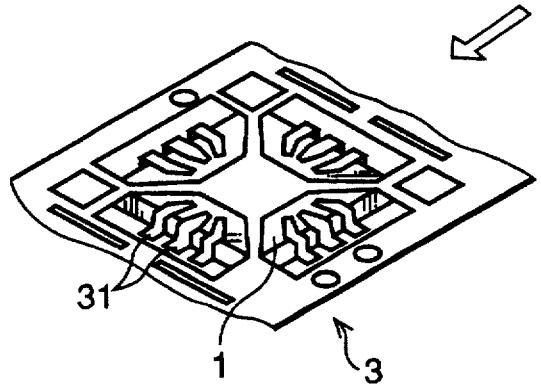

Then, as shown in FIG. 5E, a plurality of leads 31 are formed. In this embodiment, in order to form a package of the QFP type, each lead 31 is The processes up towing form. The processes up to this step are those for the preparation of the package.

Figure 6A:
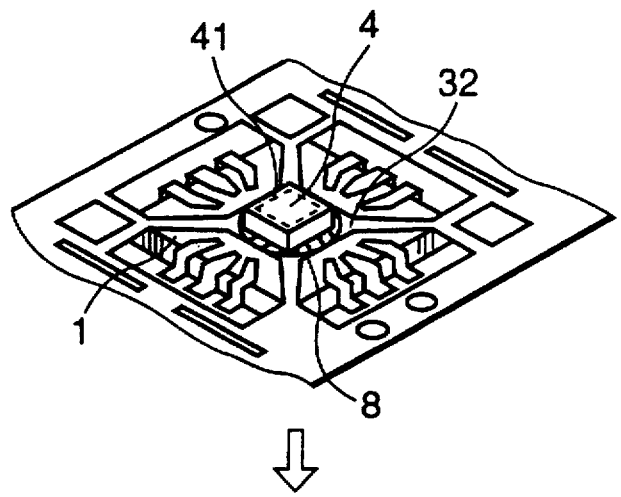
FIGS. 6A–6D are perspective views of the semiconductor device of the first embodiment according to the invention for use in explaining sequential steps during the assembling of a method for fabricating the device.

Next, the processes to follow are those for the assemblage of the package. As shown in FIG. 6A, the island 32 is applied with an Ag paste 8, and the semiconductor chip 4 is centrally mounted and fixed by thermal curing.

Figure 6B:
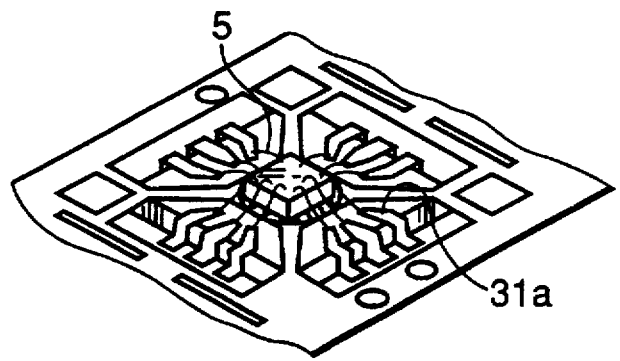
Figure 6C:
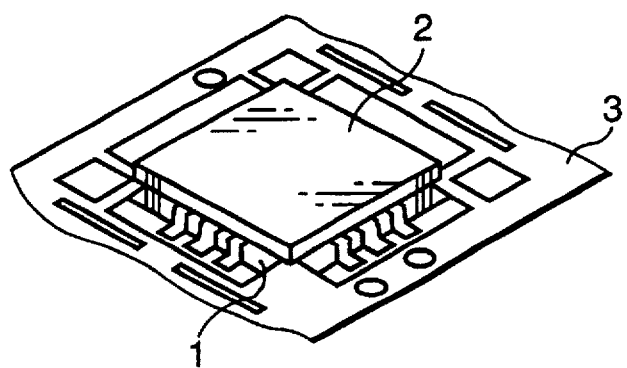
Figure 6D:
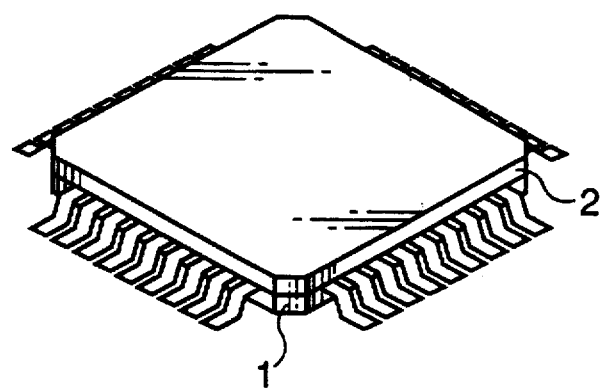

Then, as shown in FIG. 6B, the electrodes 41 on the semiconductor chip 4 are connected with the internal lead portions 31a of the leads 31 by the bonding wires 5, respectively. Thereafter, as shown in FIG. 6C, the semiconductor chip 4 is sealed. That is, the resin formed cap 2 is positioned and fixed on the base plate 1 using an adhesive agent, and they are thermally cured while being subjected to a pressure due to a spring or a weight. Then, the package is cut and separated from the lead frame 3, and the semiconductor device according to this embodiment is completed as shown in FIG. 6D.

According to the invention, the number of process steps in the assembling stage (from the introduction of the semiconductor chip) of the complete device is four, as shown in FIGS. 6A–6D, namely, (1) a step of mounting the semiconductor chip on the island of the lead frame, (2) a step of wire bonding, (3) a step of sealing, and (4) a step of cutting the lead frame, the number of which is reduced from six (including a step of plating and a step of shaping leads) required in the conventional example. Especially the time required in the assemblage stage is greatly reduced because the plating step which is time consuming is incorporated in the preparation stage of the process. Due to this, the time required from the start with the semiconductor chip to the completion of the device has been reduced to one day which is one third of the time required in the conventional example.

Figure 7:
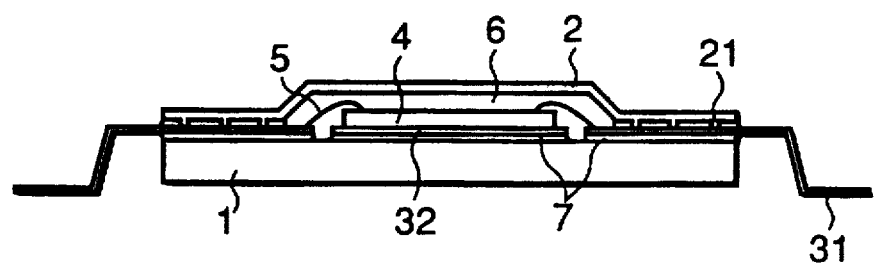
FIG. 7 is a sectional view of a semiconductor device of a second embodiment according to the invention.

FIG. 7 is a sectional view showing a structure of a second embodiment of the invention. In this embodiment, an aluminum plate which is alumite-treated to form on a surface thereof an alumina ($Al_2O$) having a thickness of about 10 μm is used for each of a base plate 1 and a cap 2. In FIG. 7, the remaining portions are the same as those in the first embodiment shown in FIG. 4A.

In this embodiment, as in the first embodiment, the undersurface of the cap 2 is provided with looped projections 21 which prevents the formation of a continuous bubble path. The structure according to this embodiment excels in the moisture-proof and heat dissipating characteristics as compared with those in the structure of the first embodiment.

While the invention has been described in its preferred embodiments, it is to be understood that the words which have been used are words of description rather than limitation and that changes within the scope of the appended claims may be made without departing from the true scope of the invention in its aspects. For example, in the explained embodiments, the same material was used for both the base plate and the cap, but this is not the requirement. One may be constituted by a metal plate and the other by a resin material. Also, in the embodiment, the base plate was flat, but the center portion thereof at which the semiconductor chip is mounted may be shaped in a concave form. Further, whereas the embodiments explained were those which related to a QFP package, the package according to the invention is not limited thereto. Also, the shape of each lead is not limited to that of gull-wing as it may be a "J" form or an "I" form.

What is claimed is:

1. A semiconductor device having a base plate, a cap, a plurality of leads sandwiched between said base plate and said cap, a semiconductor chip mounted within a cavity formed between said cap and said base plate, said leads and said semiconductor chip being electrically interconnected by internal leads of said leads and electrodes of said semiconductor chip, wherein the improvement comprises a plurality of looped projections for intercepting a path that may be formed for a gas to escape from said cavity, said plurality of looped projections being provided at an undersurface peripheral portion of the cap such that said cavity is surrounded by said loop projections.

2. The semiconductor device according to claim 1, in which one of said base plate and said cap is formed of one of metal and resin.

3. The semiconductor device according to claim 1, in which each of said leads has an outer lead shaped in a gull-wing form.

* * * * *